US010673419B2

(12) United States Patent
Lin et al.

(10) Patent No.: US 10,673,419 B2
(45) Date of Patent: Jun. 2, 2020

(54) OSCILLATOR CIRCUIT WITH TEMPERATURE COMPENSATION FUNCTION

(71) Applicant: DYNA IMAGE CORP., New Taipei (TW)

(72) Inventors: Wen-Sheng Lin, New Taipei (TW); Sheng-Cheng Lee, New Taipei (TW); Shih-Hao Lan, New Taipei (TW)

(73) Assignee: DYNA IMAGE CORP., New Taipei (TW)

( * ) Notice: Subject to any disclaimer, the term of this patent is extended or adjusted under 35 U.S.C. 154(b) by 0 days.

(21) Appl. No.: 15/482,789

(22) Filed: Apr. 9, 2017

(65) Prior Publication Data

US 2018/0123513 A1    May 3, 2018

(30) Foreign Application Priority Data

Nov. 2, 2016 (CN) .......................... 2016 1 0944256

(51) Int. Cl.
*H03K 3/03* (2006.01)
*H03K 3/011* (2006.01)

(52) U.S. Cl.
CPC ........... *H03K 3/0322* (2013.01); *H03K 3/011* (2013.01)

(58) Field of Classification Search
CPC ........ H03K 3/011; H03K 3/0315; H03K 3/03; H03K 3/0322; H03K 3/0231; H03K 3/354; H03B 5/04
See application file for complete search history.

(56) References Cited

U.S. PATENT DOCUMENTS

| 5,870,004 | A | * | 2/1999 | Lu | ......................... | H03K 3/0231 |
| | | | | | | 331/143 |
| 6,356,161 | B1 | * | 3/2002 | Nolan | ..................... | H03K 3/011 |
| | | | | | | 331/111 |
| 7,592,877 | B2 | * | 9/2009 | Shiramizu | ............ | H03K 3/0322 |
| | | | | | | 331/177 R |
| 7,969,253 | B2 | * | 6/2011 | Shiah | .................... | H03K 3/0315 |
| | | | | | | 327/156 |
| 2015/0137897 | A1 | * | 5/2015 | Sun | ....................... | H03K 3/0322 |
| | | | | | | 331/57 |

FOREIGN PATENT DOCUMENTS

WO    WO-0213384 A1 *  2/2002  ............... G11C 7/04

* cited by examiner

*Primary Examiner* — Ryan Johnson
(74) *Attorney, Agent, or Firm* — Anova Law Group, PLLC

(57) ABSTRACT

Disclosures of the present invention particularly describe oscillator circuit with temperature compensation function, consisting of a fully differential amplifier, a current mirror unit, a bias current supplying unit, a compensation unit, and a reference signal generating unit. A variety of experimental data have proved that, based on the normal operation of the compensation unit and the reference signal generating unit, an oscillation frequency of this oscillator circuit would be maintained at same level even if the ambient temperature continuously increases. Therefore, because the frequency drift due to temperature variation would not occur in the oscillator circuit of the present invention, the novel oscillator circuit is potential oscillator to replace the conventional oscillators applied in analog-to-digital convertors or time-to-digital convertors.

6 Claims, 5 Drawing Sheets

FIG. 2 (Clean)

OSCILLATOR CIRCUIT WITH TEMPERATURE COMPENSATION FUNCTION

BACKGROUND OF THE INVENTION

1. Field of the Invention

The present invention relates to the technology field of electronic circuits, and more particularly to an oscillator circuit with temperature compensation function.

2. Description of the Prior Art

Due to sensing signals monitored by various sensors are usually analog signals, different analog signal processors are developed for use in converting the sensing signals to corresponding digital signals which are easy to be processed and stored. Please refer to FIG. 1, which illustrates a block diagram of a conventional analog signal processing circuit. As FIG. 1 shows, conventional analog signal processing circuit 1' comprises at least one sensing unit 11', a pre-processing unit 12' and an analog-to-digital conversion unit 13', wherein the pre-processing unit 12' consisting of an amplifier and a filter is configured to pre-process a specific analog signal outputted by the sensing unit 11'. Subsequently, the analog signal been pre-processed is transmitted to the analog-to-digital conversion unit 13' for being further converted to a corresponding digital signal. Eventually, after receiving the digital signal, a micro control unit (MCU) 2' converts or calculates the digital signal to a numeric data which can be shown on a display 3.

As engineers skilled in development and manufacture of the analog signal processing circuit 1' know, the said analog-to-digital conversion unit 13' is normally constituted by a sample and hold circuit, a quantizer circuit, and an encoder circuit. During the operation of the analog-to-digital conversion unit 13', the sample and hold circuit is droved by a clock signal to apply a signal sampling process to an analog signal based on a sampling rate. It is worth explaining that voltage-controlled oscillator (VCO) is an elementary element for generating a specific clock signal with an oscillator frequency. Thus, it can be conscious that the VCO is one kind of semiconductor electronic component, and the semiconductor electronic component (i.e., the VCO) is bound to be subjected to errors of manufacturing processes, so as to cause variation of electrical characteristics of the VCO. On the other hand, the semiconductor electronic component (i.e., the VCO) is also bound to be influenced by ambient temperature, such that certain electrical characteristics of the VCO will drift; for example, oscillator frequency.

Thus, for frequency drift due to temperature variation is a very important issue must to be put attention thereon for analog-to-digital convertors or time-to-digital convertors, it is easy to know that, how to develop and provide an oscillator circuit without the frequency drift due to temperature variation becomes the most significant research subjects. For above reasons, the inventors of the present application have made great efforts to make inventive research thereon and eventually provided an oscillator circuit with temperature compensation function.

SUMMARY OF THE INVENTION

The primary objective of the present invention is to provide an oscillator circuit with temperature compensation function. Differing from conventional oscillator circuit does not include temperature compensation function, the present invention particularly constitutes a fully differential amplifier, a current mirror unit, a bias current supplying unit, a compensation unit, and a reference signal generating unit to a novel oscillator circuit having temperature compensation function. A variety of experimental data have proved that, based on the normal operation of the compensation unit and the reference signal generating unit, the oscillator frequency of the oscillator circuit of the present invention almost be kept at same level even if the ambient temperature continuously increases. Therefore, because the frequency drift due to temperature variation would not occur in the oscillator circuit of the present invention, the novel oscillator circuit is potential oscillator to replace the conventional oscillators applied in analog-to-digital convertors or time-to-digital convertors.

In order to achieve the primary objective of the present invention, the inventor of the present invention provides one embodiment for the oscillator circuit with temperature compensation function, comprising:
a fully differential amplifier;
a current mirror unit, being coupled to the fully differential amplifier for supplying at least one bias current to the fully differential amplifier;
a bias current supplying unit, being coupled to the current mirror unit and the fully differential amplifier for supplying a clamping current to the fully differential amplifier;
a unit, being coupled to the fully differential amplifier and the current mirror unit, and used for producing a first reference current to the current mirror unit according to an output signal of the fully differential amplifier; wherein the unit stops the supplying of the first reference current while a voltage level of the output signal is greater than a specific threshold voltage;
a compensation unit, being coupled to the current mirror unit; and
a reference signal generating unit, producing a reference signal to the compensation unit according to a temperature parameter of the fully differential amplifier and an ambient temperature, such that the modulation of a specific oscillator frequency of the output signal of the fully differential amplifier is achieved after the compensation unit generates a second reference current to the current mirror unit for adjust the clamping current based on the reference signal.

In the circuit designing of the embodiment for the oscillator circuit with temperature compensation function, the fully differential amplifier is a voltage-controlled oscillator (VCO).

In the circuit designing of the embodiment for the oscillator circuit with temperature compensation function, the compensation unit comprises a seventh MOSFET and a source resistor; wherein seventh MOSFET is coupled to a second supply voltage (Vss) by the source terminal thereof, and the drain terminal and the gate drain terminal of the seventh MOSFET ARE individually coupled to the reference signal generating unit and the drain terminal of the first MOSFET. Moreover, the source resistor is coupled between the source terminal of the seventh MOSFET and the second supply voltage (Vss).

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe an oscillator circuit with temperature compensation function according to the present invention, embodiments of the present invention will be described in detail with reference to the attached drawings hereinafter.

Figure 1:
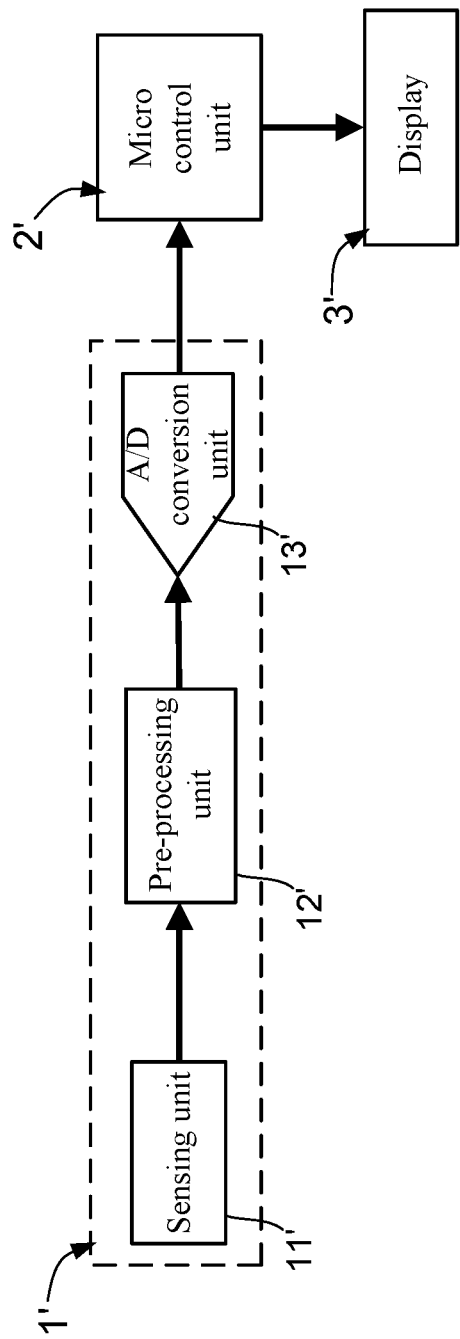
FIG. 1 shows a block diagram of a conventional analog signal processing circuit.
Figure 2:
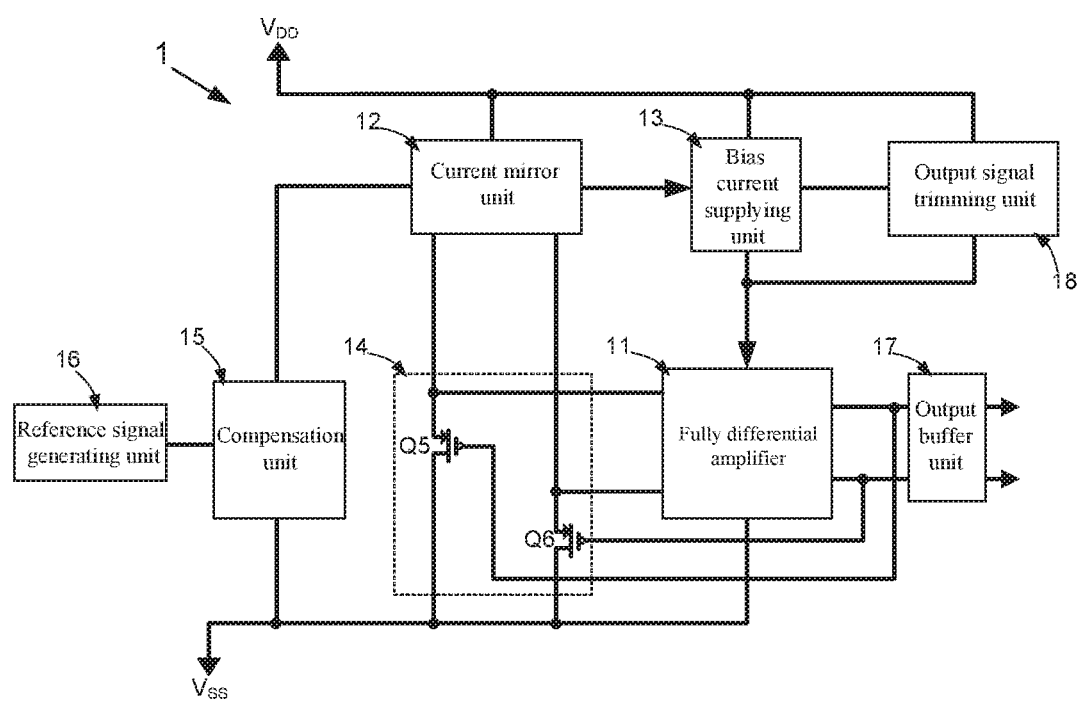
FIG. 2 shows a block diagram of an oscillator circuit with temperature compensation function according to the present invention.

Please refer to FIG. 2, there is illustrated a block diagram of an oscillator circuit with temperature compensation function according to the present invention. As FIG. 2 shows, the oscillator circuit 1 of the present invention mainly comprises: a fully differential amplifier 11, a current mirror unit 12, a bias current supplying unit 13, a compensation unit 15, a reference signal generating unit 16, an output buffer unit 17, and an output signal trimming unit 18, wherein the fully differential amplifier 11 is configured as a voltage-controlled oscillator (VCO), and has a positive input terminal, a negative input terminal, a positive bias terminal, a negative positive terminal, a positive output terminal, a negative output terminal.

Figure 3:
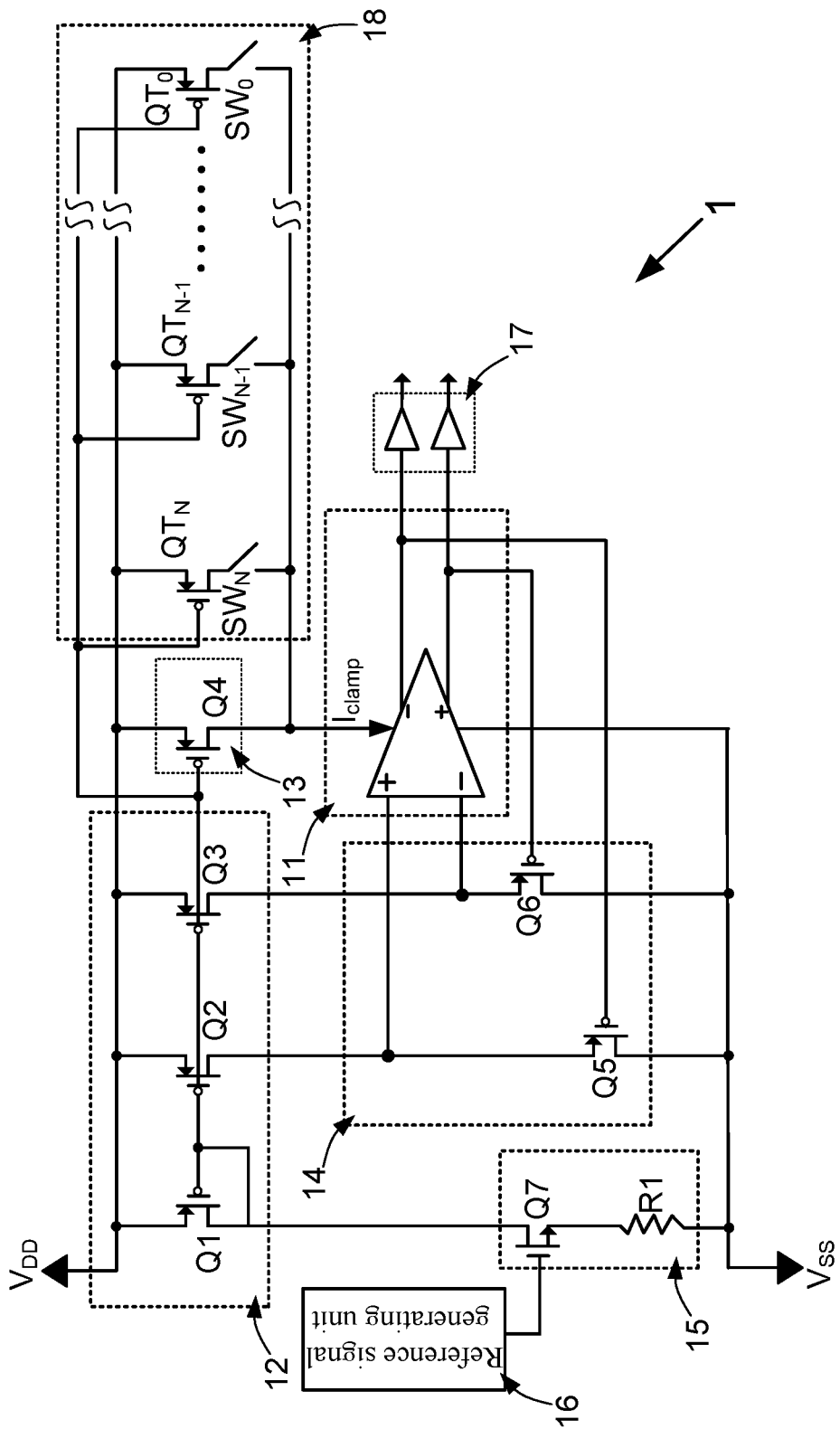
FIG. 3 shows a circuit architecture diagram of the oscillator circuit with temperature compensation function.

Continuously referring to FIG. 2, and please simultaneously refer to FIG. 3, where a circuit architecture diagram of the oscillator circuit with temperature compensation function is provided. As FIG. 2 and FIG. 3 show, the current mirror unit 12, consisting of a first MOSFET Q1, a second MOSFET Q2, and a third MOSFET Q3, is coupled to the fully differential amplifier 11 for supplying at least one bias current to the fully differential amplifier 11. It is worth explaining that, P-type MOSFET is particularly used as the first MOSFET Q1, the second MOSFET Q2, and the third MOSFET Q3 in the circuit arrangement of the present invention. On the other hand, the first MOSFET Q1 is coupled to a first supply voltage VDD by the source terminal thereof, and the gate terminal and the drain terminal of the first MOSFET Q1 is coupled to each other. Moreover, the second MOSFET Q2 is also coupled to the first supply voltage $V_{DD}$ by the source terminal thereof, and the gate terminal of the second MOSFET Q2 is coupled to the gate terminal of the first MOSFET Q1. In addition, the third MOSFET Q3 is coupled to the first supply voltage $V_{DD}$ by the source terminal thereof, and the gate terminal of the third MOSFET Q3 is coupled to the gate terminal of the first MOSFET Q1.

In the circuit arrangement of the oscillator circuit 1 of the present invention, the bias current supplying unit 13 is coupled to the current mirror unit 12 and the fully differential amplifier 11 for supplying a clamping current to the fully differential amplifier 11. As FIG. 2 and FIG. 3 show, the bias current supplying unit 13 comprises a fourth MOSFET Q4 (i.e., a clamping current transmitting MOSFET), and the source terminal, the gate terminal and the drain terminal of the fourth MOSFET Q4 are coupled to the first supply voltage $V_{DD}$, the gate terminal of the first MOSFET Q1, and the positive bias terminal of the fully differential amplifier 11, individually. Herein, it needs to further explain that, it is easy for electronic engineers to calculate the oscillator frequency of the fully differential amplifier 11 by using mathematical formula of $f_{osc} \propto I/(V \times C)$ because the fully differential amplifier 11 is a voltage-controlled oscillator (VCO). In the mathematical formula, V and C mean a phase switching voltage and an effective capacitor of the fully differential amplifier 11, respectively. Moreover, I represents a charging current of the effective capacitor, wherein the said charging current is the clamping current $I_{clamp}$ used for clamping the oscillator frequency. Briefly speaking, the primary technology feature of the present invention is to lower the frequency drift due to temperature variation occurring in the VCO (i.e., fully differential amplifier 11) by modulating the clamping current $I_{clamp}$.

As FIG. 2 and FIG. 3 show, a fifth MOSFET Q5 (i.e., a first input current adjusting MOSFET) and a sixth MOSFET Q6 (i.e., a second input current adjusting MOSFET) constitute a unit 14, wherein the fifth MOSFET Q5 is coupled to the drain terminal of the second MOSFET Q2 by the source terminal thereof; moreover, the drain terminal and the gate terminal of the fifth MOSFET Q5 are individually coupled to a second supply voltage Vss and the negative output terminal of the fully differential amplifier 11. On the other hand, the sixth MOSFET Q6 is coupled to the drain terminal of the third MOSFET Q3 by the source terminal thereof, and the drain terminal and the gate terminal of the sixth MOSFET Q6 are individually coupled to the second supply voltage Vss and the positive output terminal of the fully differential amplifier 11. In the circuit arrangement of the present invention, the unit 14 consisting of the sixth MOSFET Q6 and the fifth MOSFET Q5 is configured to produce a first reference current to the current mirror unit 12 according to an output signal of the fully differential amplifier 11. To more detailedly explain that, as FIG. 3 shows, the positive input terminal of the fully differential amplifier 11 is electrically connected between the current mirror 12 and the source terminal of the fifth MOSFET Q5, and the negative input terminal of the fully differential amplifier 11 is electrically connected between the current mirror 12 and the source terminal of the sixth MOSFET Q6. By such arrangement, the fifth MOSFET Q5 is able to adjust a positive input current receiving by the positive input terminal of the fully differential amplifier 11 based on the negative output signal, and the sixth MOSFET Q6 is able to adjust a negative input current receiving by the negative input terminal of the fully differential amplifier 11 based on the positive output signal. Therefore, the unit 14 is particularly designed and configured to stop the supplying of the first reference current while a voltage level of the output signal is greater than a specific threshold voltage.

Particularly, the compensation unit 15 comprising a seventh MOSFET Q7 and a source resistor R1 is coupled to the current mirror unit 12. As FIG. 2 and FIG. 3 show, the seventh MOSFET Q7 is coupled to the second supply voltage Vss by the source terminal thereof, and the drain terminal and the gate drain terminal of the seventh MOSFET Q7 are individually coupled to the reference signal generating unit 16 and the drain terminal of the first MOSFET Q1. Moreover, the source resistor R1 is coupled between the source terminal of the seventh MOSFET Q7 and the second supply voltage Vss. By such circuit arrangement for the oscillator circuit 1, the reference signal generating unit 16 is able to produce a reference signal to the compensation unit 15 according to an ambient temperature, such that the modulation of the oscillator frequency of the output signal is achieved after the compensation unit 15 generates a second reference current to the current mirror unit 12 for adjust the clamping current $I_{clamp}$ based on the reference signal.

It is worth explaining that, each of the first MOSFET Q1, the second MOSFET Q2, the third MOSFET Q3, the fourth MOSFET Q4, the fifth MOSFET Q5, and the sixth MOSFET Q6 are a P-type MOSFET, and the seventh MOSFET Q7 is a N-type MOSFET. In addition, the oscillator circuit 1 with temperature compensation function further comprises an output buffer unit 17 coupled to the positive output terminal and the negative output terminal of the fully differential amplifier 11.

On the other hand, for the VCO is usually applied in analog-to-digital convertors or time-to-digital convertors, the fully differential amplifier 11 in the oscillator circuit 1 must be a frequency tunable VCO. As the engineers skilled in development of VOC circuits know, the oscillator frequency of the output signal ($V_{out}$) of the VCO can be calculated by using following mathematical formula: $\omega_{out}=\omega_0+K_{VCO}*V_{out}$. In the mathematical formula $K_{VCO}$ represents sensitivity or gain of circuit, and $\omega_0$ means an intercross point of $V_{out}=0$. Therefore, it is able to know that coo and $V_{out}$ are factors for modulating the oscillator frequency of the fully differential amplifier 11 (i.e., the VCO). For purpose of frequency tuning, the present invention particularly makes an output signal trimming unit 18 be coupled to the bias current supplying unit 13 and the fully differential amplifier 11.

As FIG. 3 shows, the output signal trimming unit 18 comprises a plurality of trimming MOSFETs ($Q_{TN}$, $Q_{TN-1}$, ..., $Q_{T0}$) and a plurality of enabling switches ($SW_N$, $SW_{N-1}$, ..., $SW_0$). In circuit arrangement of the output signal trimming unit 18, P-type MOSFET is used as the trimming MOSFET.

Moreover, each one of the trimming MOSFETs ($Q_{TN}$, $Q_{TN-1}$, ..., $Q_{T0}$) is coupled to the gate terminal of the fourth MOSFET Q4 by the gate terminal thereof, and the source terminal and drain terminal of the trimming MOSFET are individually coupled to the first supply voltage $V_{DD}$ and the fully differential amplifier 11. On the other hand, each one of the enabling switches ($SW_N$, $SW_{N-1}$, ..., $SW_0$) is coupled between the fully differential amplifier 11 and the drain terminal of the trimming MOSFET. By such circuit arrangement, it is able to utilize an external micro control unit (MCU) to enable and/or disable the trimming MOSFETs ($SW_N$, $SW_{N-1}$, ..., $SW_0$) by switching the enabling switches ($SW_N$, $SW_{N-1}$, ..., $SW_0$) to short circuit and/or open circuit, so as to achieve the trimming of the output signal ($V_{out}$) of the fully differential amplifier 11.

Thus, above descriptions have completely and clearly introduced the circuit architecture and operation of the oscillator circuit 1 with temperature compensation function according to the present invention. In following paragraphs, the practicability of the novel oscillator circuit 1 will be subsequently presented through a variety of experimental data.

Figure 4:
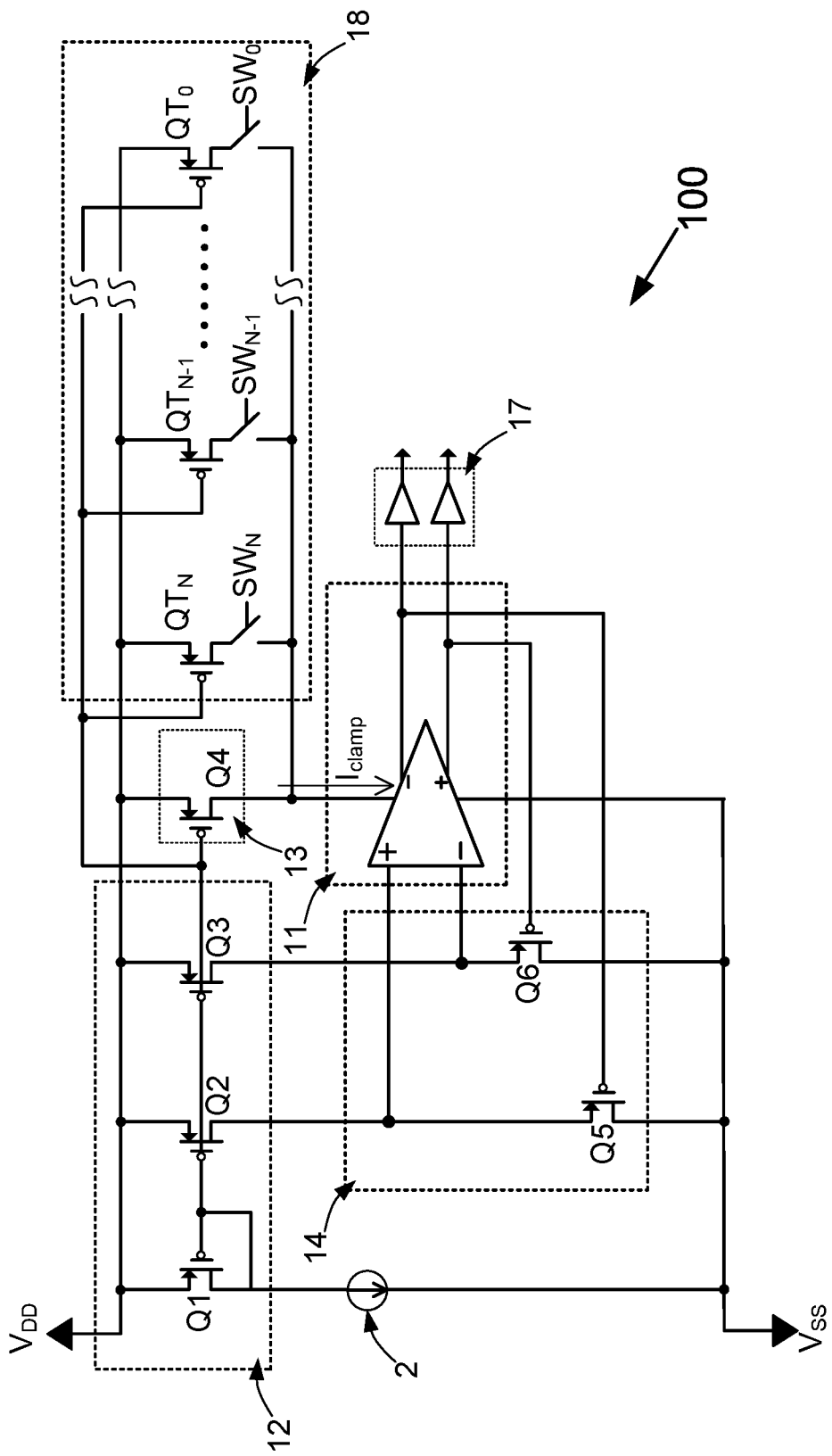
FIG. 4 shows a circuit architecture diagram of an oscillator circuit without temperature compensation function.
Figure 5:
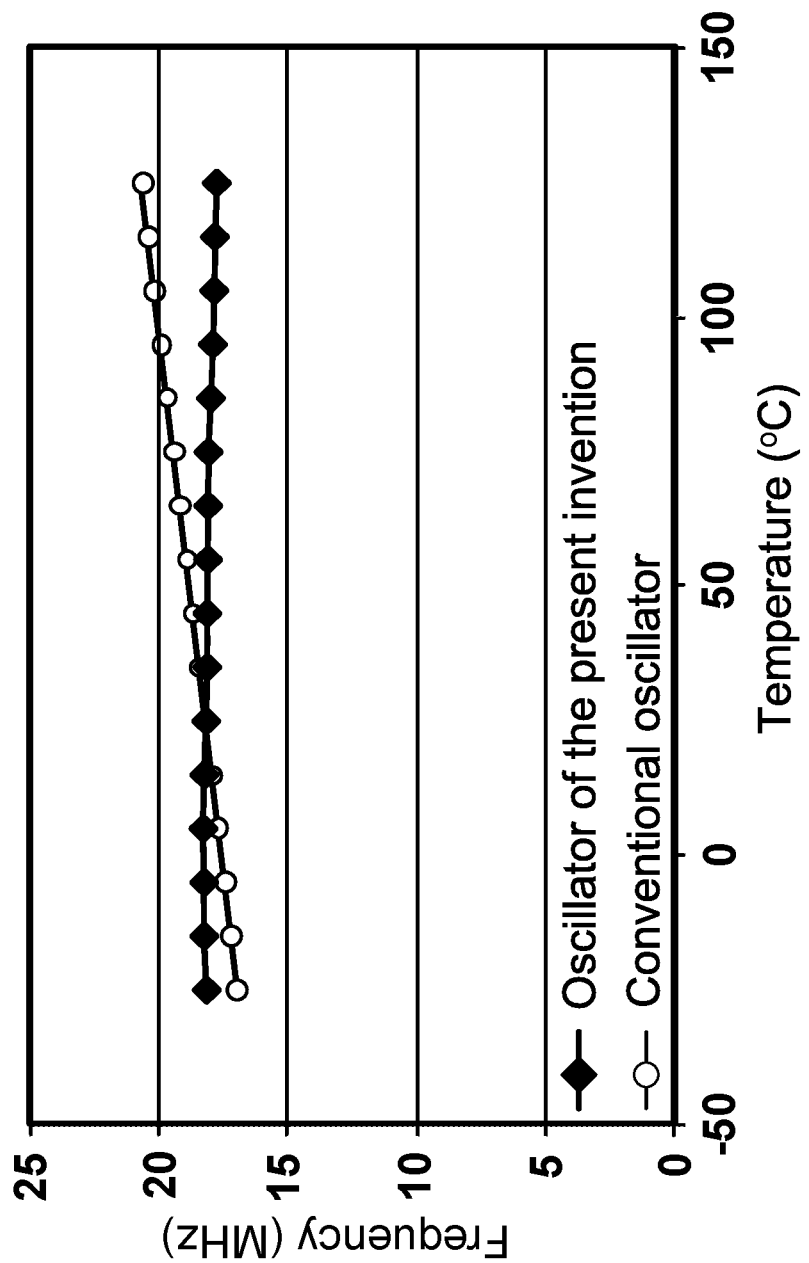
FIG. 5 shows a data curve graph of temperature versus frequency.

Please refer to FIG. 4, where a circuit architecture diagram of a oscillator circuit without temperature compensation function is provided. After comparing FIG. 4 with FIG. 3, it is found that the oscillator circuit 100 of FIG. 4 merely includes a constant current source 2 instead of the compensation unit 15 and the reference signal generating unit 16 shown in FIG. 3. Please continuously refer to FIG. 5, which provides a data curve graph of temperature versus frequency. From FIG. 5, it can find that the oscillator frequency of the conventional oscillator circuit 100 goes up with the increasing of ambient temperature. On the contrary, based on the normal operation of the compensation unit 15 and the reference signal generating unit 16, the oscillator frequency of the oscillator circuit 1 of the present invention almost be kept at same level even if the ambient temperature continuously increases. Thus, experimental data of FIG. 5 have proved that the oscillator circuit 1 of the present invention indeed has a temperature compensation function.

It is worth explaining that, the fifth MOSFET Q5 and the sixth MOSFET Q6 are utilized to provide a positive current adjustment for the fully differential amplifier 11. Moreover, based on the mathematical formula of $f_{foc} \propto I/(V \times C)$, the compensation unit 15 consisting of the seventh MOSFET Q7 and the source resistor R1 are used for applying a negative current adjustment to the fully differential amplifier 11.

As the electronic engineers know, drain current of a MOSFET can be calculated by using the mathematical formula of $I_D=k(V_{GS}-V_{th})^2$. In the mathematical formula, $V_{GS}$ means a difference voltage between the gate terminal and the source terminal of the MOSFET, and k represents a gain factor. It is worth explaining that, $V_{th}$, a threshold voltage of the MOSFET, is inversely proportional to ambient temperature or device operation temperature. Thus, by utilizing the mathematical formula of $I_D=k(V_{GS}-V_{th})^2$, it is able to control the reference signal generating unit 16 produce a reference signal to the seventh MOSFET Q7 of the compensation unit 15 according to a temperature parameter of the fully differential amplifier 11 and an ambient temperature. Subsequently, as long as the resistance of the source resistor R1 and the level of the reference signal are properly controlled, it is very easy to achieve the aforesaid negative current adjustment by facilitating the seventh MOSFET Q7 output a second reference current to the current mirror unit 12.

Therefore, through above descriptions, the oscillator circuit 1 with temperature compensation function provided by the present invention has been introduced completely and clearly; in summary, the present invention includes the advantages of:

(1) Differing from conventional oscillator circuit does not include temperature compensation function, the present invention particularly constitutes a fully differential amplifier 11, a current mirror unit 12, a bias current supplying unit 13, a compensation unit 15, and a reference signal generating unit 16 to a novel oscillator circuit having temperature compensation function. A variety of experimental data have proved that, based on the normal operation of the compensation unit 15 and the reference signal generating unit 16, the oscillator frequency of the oscillator circuit 1 of the present invention almost be kept at same level even if the ambient temperature continuously increases. Therefore, because the frequency drift due to temperature variation would not occur in the oscillator circuit 1 of the present invention, the novel oscillator circuit 1 is potential oscillator to replace the conventional oscillators applied in analog-to-digital convertors or time-to-digital convertors.

The above description is made on embodiments of the present invention. However, the embodiments are not intended to limit scope of the present invention, and all equivalent implementations or alterations within the spirit of the present invention still fall within the scope of the present invention.

What is claimed is:

1. An oscillator circuit with temperature compensation function, comprising:
   a fully differential amplifier (11), having a positive input terminal, a negative input terminal, a positive bias terminal, a negative bias terminal, a positive output terminal, a negative output terminal;
   a current mirror unit (12), comprising:
      a first MOSFET (Q1), being coupled to a first supply voltage (VDD) by a source terminal thereof, and a gate terminal and a drain terminal of the first MOSFET (01) being coupled to each other;
      a second MOSFET (Q2), being coupled to the first supply voltage (VDD) by a source terminal thereof, and a gate terminal of the second MOSFET (Q2) being coupled to the gate terminal of the first MOSFET (Q1); and
      a third MOSFET (Q3), being coupled to the first supply voltage (VDD) by a source terminal thereof, and a gate terminal of the third MOSFET (Q3) being coupled to the gate terminal of the first MOSFET (Q1);
   a bias current supplying unit (13), comprising a fourth MOSFET (Q4), wherein a source terminal of the fourth MOSFET (Q4) is coupled to a first supply voltage (VDD), and a drain terminal and a gate terminal of the fourth MOSFET (Q4) being electrically connected to the positive bias terminal of the fully differential amplifier (11) and the gate terminal of the first MOSFET (Q1), respectively;
   a fifth MOSFET (Q5), being electrically connected to the current mirror unit (12) and the negative output terminal of the fully differential amplifier (11) by a source terminal and a gate terminal thereof, and a second supply voltage (Vss) being coupled to a drain terminal of the fifth MOSFET (Q5); and
   a sixth MOSFET (Q6), being electrically connected to the current mirror unit (12) and the positive output terminal of the fully differential amplifier (11) by a source terminal and a gate terminal thereof, and the second supply voltage (Vss) being coupled to a drain terminal of the sixth MOSFET (Q6);
   wherein the positive input terminal of the fully differential amplifier (1) is electrically connected between the current mirror (12) and the source terminal of fifth MOSFET (Q5), and the negative input terminal of the fully differential amplifier (11) being electrically connected between the current mirror (12) and the source terminal of the sixth MOSFET (Q6);
   a compensation unit (15), being electrically connected to the current mirror (12); and a reference signal generating unit (16), producing a reference signal to the compensation unit (15) according to an ambient temperature such that the compensation unit (15) enables the current mirror (12) based on the reference signal;
   wherein the fourth MOSFET (Q4) transmits a current ($I_{clamp}$) to the fully differential amplifier (11) after the current mirror unit (12) is enabled, so as to modulate a specific oscillator frequency of a positive output signal and a negative output signal of the fully differential amplifier (11);
   wherein the fifth MOSFET (Q5) adjusts a positive input current receiving by the positive input terminal of the fully differential amplifier (11) based on the negative output signal, and the sixth MOSFET (Q6) adjusts a negative input current receiving by the negative input terminal of the fully differential amplifier (11) based on the positive output signal.

2. The oscillator circuit with temperature compensation function of claim 1, further comprising an output buffer unit (17) coupled to the positive output terminal and the negative output terminal of the fully differential amplifier (11).

3. The oscillator circuit with temperature compensation function of claim 1, wherein the compensation unit comprises:
   a seventh MOSFET (Q7), being coupled to the second supply voltage (Vss) by a source terminal thereof, and a drain terminal and a gate drain terminal of the seventh MOSFET (Q7) being individually coupled to the reference signal generating unit (16) and the drain terminal of the first MOSFET (Q1); and
   a source resistor (R1), being coupled between the source terminal of the seventh MOSFET (Q7) and the second supply voltage (Vss).

4. The oscillator circuit with temperature compensation function of claim 3, wherein each of the first MOSFET (Q1), the second MOSFET (Q2), the fourth MOSFET (Q4), the fifth MOSFET (Q5), and the sixth MOSFET (Q6) are a P-type MOSFET, and the seventh MOSFET (Q7) being a N-type MOSFET.

5. The oscillator circuit with temperature compensation function of claim 3, further comprising an output signal trimming unit (18) coupled to the bias current supplying unit (13) and the fully differential amplifier (11), comprising:
   a plurality of trimming MOSFETs ($Q_{TN}$, $Q_{TN-1}$, ..., $Q_{T0}$), wherein each of the plurality of trimming MOSFETs ($Q_m$, $Q_{m-1}$, ..., $Q_{T0}$) is coupled to the gate terminal of the fourth MOSFET (Q4) by a gate terminal thereof, and a source terminal and a drain terminal of each of the plurality the trimming MOSFETs ($Q_{TN}$, $Q_{TN-1}$, ..., $Q_{T0}$) being individually coupled to the first supply voltage ($V_{DD}$) and the fully differential amplifier (11); and
   a plurality of enabling switches ($SW_N$, $SW_{N-1}$, ..., $SW_0$), wherein each of the plurality of enabling switches ($SW_N$, $SW_{N-1}$, ..., $SW_0$) is coupled between the fully differential amplifier (11) and the drain terminal of each of the plurality of trimming MOSFET s ($Q_{TN}$, $Q_{TN-1}$, ..., $Q_{T0}$).

6. The oscillator circuit with temperature compensation function of claim 5, wherein each of the plurality of trimming MOSFETs are a P-type MOSFET.

* * * * *